(12) United States Patent
Iwamoto

(10) Patent No.: US 11,145,528 B2
(45) Date of Patent: Oct. 12, 2021

(54) LOAD PORT APPARATUS AND METHOD OF MOUNTING CONTAINER

(71) Applicant: TDK Corporation, Tokyo (JP)

(72) Inventor: Tadamasa Iwamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/818,523

(22) Filed: Mar. 13, 2020

(65) Prior Publication Data

US 2020/0303227 A1  Sep. 24, 2020

(30) Foreign Application Priority Data

Mar. 18, 2019 (JP) .............................. JP2019-049941

(51) Int. Cl.
*H01L 21/673* (2006.01)
*H01L 21/687* (2006.01)
*H01L 21/677* (2006.01)

(52) U.S. Cl.
CPC .... *H01L 21/67393* (2013.01); *H01L 21/6773* (2013.01); *H01L 21/68742* (2013.01)

(58) Field of Classification Search
None
See application file for complete search history.

(56) References Cited

U.S. PATENT DOCUMENTS

| 6,755,221 | B2 * | 6/2004 | Jeong ................ H01L 21/67259 141/63 |
| 2011/0214778 | A1 * | 9/2011 | Natsume ........... H01L 21/67775 141/4 |
| 2017/0243776 | A1 * | 8/2017 | Murata ............. H01L 21/67393 |
| 2018/0254209 | A1 * | 9/2018 | Kawai .............. H01L 21/67772 |
| 2020/0114403 | A1 * | 4/2020 | Iwamoto ........... H01L 21/67389 |

FOREIGN PATENT DOCUMENTS

JP   2011-187539 A   9/2011

OTHER PUBLICATIONS

Wilko 3 Pin Plug With Fuse White 5amp, see attached NPL for URL, accessed Nov. 30, 2020 (Year: 2020).*

* cited by examiner

*Primary Examiner* — Gerald McClain
(74) *Attorney, Agent, or Firm* — Oliff PLC

(57) ABSTRACT

A load port apparatus includes a mount member, a purge nozzle, and a plurality of pins. The mount member mounts a container. The nozzle introduces a cleaning gas into the container mounted on the mount member via a purge port disposed on a bottom of the container. The pins support the container from below by each contacting with a predetermined position of the bottom of the container. The pins are relatively vertically movable to the mount member between a first position and a second position where an upper tip of each of the pins is located lower than that at the first position. The upper tip of each of the pins at the first position contacts with the predetermined position of the container. The upper tip of each of the pins at the second position contacts with the predetermined position of the container.

10 Claims, 10 Drawing Sheets

LOAD PORT APPARATUS AND METHOD OF MOUNTING CONTAINER

BACKGROUND OF THE INVENTION

The present invention relates to a load port apparatus for mounting a container for containing a substrate and to a method of mounting the container.

In semiconductor factories, substrates (e.g., silicon wafers) are transported and stored using a container containing the substrates. The container is sealed, but the cleanliness of the container may decrease due to outgas generated from the contained substrates, leak and gas permeation from a sealed part of the container.

Then, thereby proposed as load port apparatuses for delivering a container in semiconductor factories is one including a purge nozzle for gas purge from the bottom of the container. The load port apparatus including the purge nozzle connects the purge nozzle with a purge port disposed on the bottom of the container and can introduce a cleaning gas into the container via the purge nozzle.

Patent Document 1: JP2011187539 (A)

BRIEF SUMMARY OF INVENTION

In conventional load port apparatuses, however, the purge nozzle is connected to the purge port of the container by raising the purge nozzle after the container is fixed to the mount member. Such load port apparatuses need to vertically move the purge nozzle and may thereby have a problem of inflow of particles generated in a movable part of the purge nozzle into a flow channel of a cleaning gas to be introduced into the container. When the purge nozzle excessively strongly collides with the purge port in the connection of the purge nozzle with the purge port, the conventional load port apparatuses have problems of short durability life due to progress of abrasion of the container, particle generation near the flow channel for the cleaning gas, and the like.

The present invention has been achieved under such circumstances. It is an object of the invention to provide a load port apparatus including a purge nozzle capable of preventing particle generation in the surroundings of a flow channel of cleaning gas.

To achieve the above object, a load port apparatus according to the present invention includes:

a mount member configured to mount a container for containing a substrate;

a purge nozzle configured to introduce a cleaning gas into the container mounted on the mount member via a purge port disposed on a bottom of the container; and a plurality of pins configured to support the container from below by each contacting with a predetermined position of the bottom of the container, wherein the pins are relatively vertically movable to the mount member between a first position and a second position where an upper tip of each of the pins is located lower than that at the first position, wherein the upper tip of each of the pins at the first position contacts with the predetermined position of the container while the purge port is away upward from the purge nozzle fixed to the mount member, and wherein the upper tip of each of the pins at the second position contacts with the predetermined position of the container while the purge port is contacted with the purge nozzle.

Since the pins for supporting the container are movable between the first position and the second position, the load port apparatus according to the present invention can appropriately connect the purge nozzle with the purge port even though the purge nozzle is fixed to the mount member. Moreover, the container transported to the load port apparatus by, for example, OHT firstly contacts with the pins at the first position, and the load port apparatus can thereby prevent a problem of excessively strong collision of the purge nozzle with the purge port. Moreover, since the purge nozzle is fixed to the mount member, an abrasion part due to the motion of the purge nozzle is not generated in the surroundings of the flow channel, and the load port apparatus can thereby prevent a problem of particle inflow to the flow channel for the cleaning gas to be introduced into the container.

For example, the load port apparatus according to the present invention may further include a horizontal driver configured to horizontally move the mount member, the purge nozzle, and the pins located at the second position while maintaining a position relation among the mount member, the purge nozzle, and the pins.

The load port apparatus including the horizontal drive can dock the container with, for example, an EFEM and transport the substrate from the container while continuing to introduce the cleaning gas from the purge nozzle into the container.

For example, the load port apparatus according to the present invention may further include an energization member configured to energize each of the pins from the second position toward the first position.

When the container is not mounted on the mount member, the load port apparatus including the energization member can automatically arrange the pins at the first position. The energization member can prevent a problem of strong collision between the purge nozzle and the purge port and can adjust the contact strength between the purge nozzle and the purge port. Moreover, the energization member shrinks in the contact between each of the pins and the container and can also prevent a problem of strong collision between the pins and the container.

For example, the load port apparatus according to the present invention may further include a pin driver configured to move the pins between the first position and the second position.

The load port apparatus including the pin driver controls a vertical movement of the pins and thereby makes it possible to prevent a strong collision between the purge nozzle and the purge port and to adjust a contact strength between the purge nozzle and the purge port. Moreover, when the vertical movement of the pins is controlled based on the weight of the container to be mounted, the load port apparatus including the pin driver can further appropriately adjust the contact strength between the purge nozzle and the purge port.

For example, the mount member may have a mount-member top surface facing the bottom of the container mounted on the mount member, the pins and the purge nozzle may protrude upward from the mount-member top surface, and the upper tip of each of the pins at the first position may be located higher than an upper end of the purge nozzle.

The load port apparatus having such a position relation among the upper tips of the pins, the purge nozzle, and the mount-member top surface can easily mount the container on the mount member with an appropriate posture and advantageously connect the purge nozzle with the purge port.

For example, the pins at the first position may support the container from below so that the bottom of the container is located away upward from an upper end of the purge nozzle.

In this structure, the load port apparatus can prevent the purge nozzle and the purge port from contacting with each other with an unexpected strength immediately after the container contacts with the pins and can securely prevent the damage of the purge port of the container, the purge nozzle of the mount member, or the like.

For example, the mount member may have a mount-member top surface facing the bottom of the container mounted on the mount member, and the purge nozzle may be fixed to the mount member so that an upper end of the purge nozzle protrudes upward from the mount-member top surface by a predetermined length.

In this structure, the load port apparatus can advantageously connect the purge nozzle with the purge port based on change in position of the bottom of the container in conjunction with the motion of the pins.

For example, the mount member may have a stopper configured to stop a downward movement of each of the pins at the second position.

When the mount member has such a stopper, the position (height) of the container in the connection between the purge nozzle and the purge port can easily be even. In this structure, the load port apparatus can thereby easily carry out operations (e.g., a transportation of the substrate in the container) while introducing the cleaning gas by the purge nozzle.

For example, the purge nozzle may include a first detector configured to detect a contact between the purge nozzle and the purge port.

In this structure, the first detector can detect a secure connection between the purge nozzle and the purge port, and the load port apparatus can prevent a leak problem of the cleaning gas to the outside of the flow channel caused by starting introducing the cleaning gas in an incomplete connection between the purge nozzle and the purge port.

For example, each of the pins may include a second detector configured to detect a contact between each of the pins and the predetermined position of the container.

The second detector detects a contact between each of the pins and the container. This makes it possible to confirm whether or not the container is correctly supported by the pins and to prevent a mount failure of the container.

For example, the mount member may include a guide configured to guide a vertical relative movement of each of the pins by restricting its horizontal movement.

In this structure, since the pins can move further smoothly vertically, the load port apparatus can further securely mount the container and connect the purge nozzle with the purge port.

For example, the number of pins may be at least three, and a horizontal relative position of the container to the mount member may be constant between a first contact state of the container with the pins at the first position and a second contact state of the container with the pins at the second position.

In this structure, the pins advantageously function as kinematic pins for positioning the container to the mount member.

A method of mounting a container containing a substrate on a load port apparatus including:

a mount member configured to mount the container;

a purge nozzle configured to introduce a cleaning gas into the container via a purge port disposed on a bottom of the container; and a plurality of pins configured to support the container from below by each contacting with a predetermined position of the bottom of the container, the method according to the present invention includes the steps of:

contacting an upper tip of each of the pins at a first position with the predetermined position of the container while the purge port is away upward from the purge nozzle fixed to the mount member, moving the pins downward from the first position while the upper tip of each of the pins is contacted with the predetermined position of the container, and contacting the purge port with the purge nozzle while the upper tip of each of the pins at a second position located lower than the first position is contacted with the predetermined position of the container.

The method can prevent a problem of excessively strong collision of the purge nozzle with the purge port even if the purge nozzle is fixed to the mount member and can appropriately connect the purge nozzle with the purge port. Since the purge nozzle is fixed to the mount member, the method can prevent a problem of particle inflow to the flow channel for the cleaning gas to be introduced into the container.

DETAILED DESCRIPTION OF INVENTION

Hereinafter, the present invention is explained based on an embodiment shown in the figures.

Figure 1:
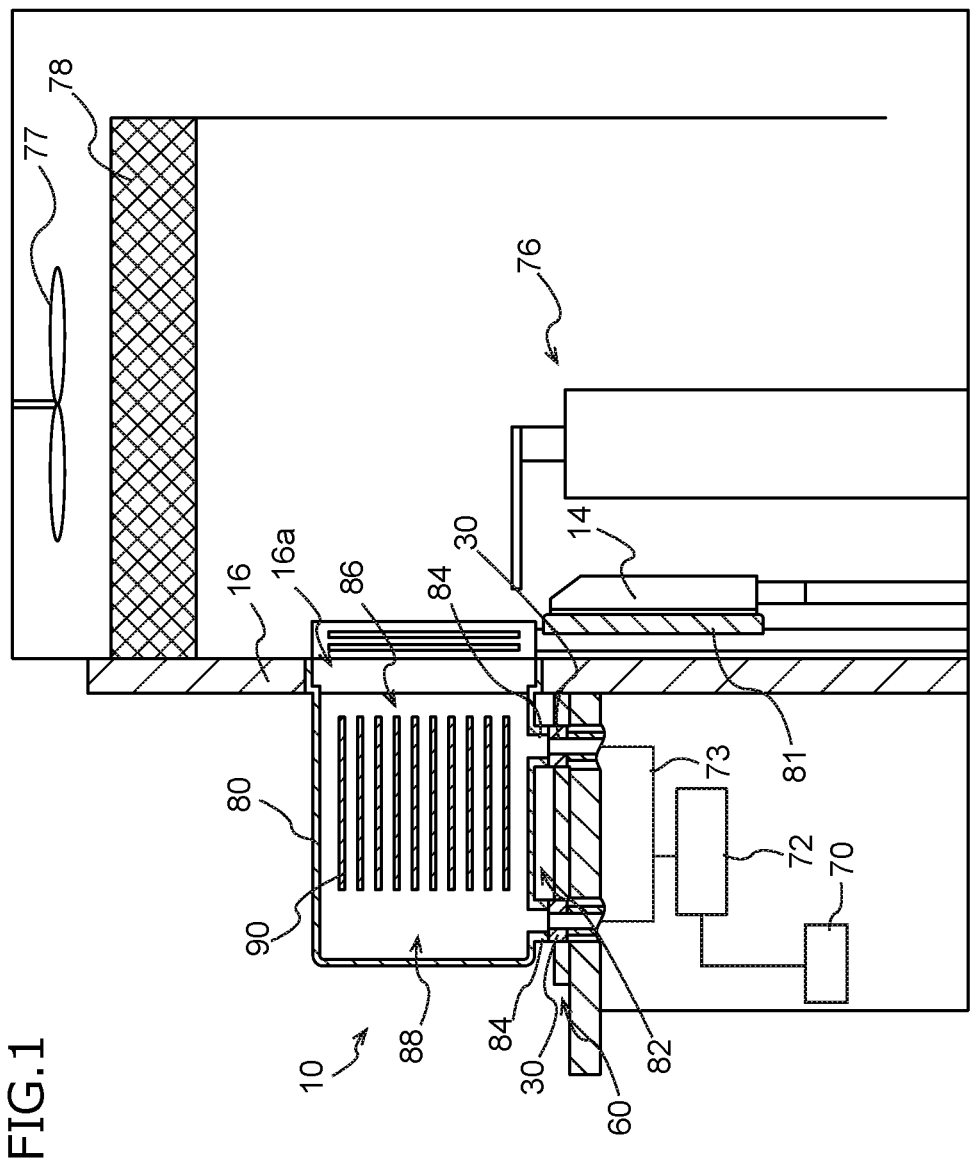
FIG. 1 is a schematic view of an EFEM including a load port apparatus according to an embodiment of the present invention and a container mounted on the load port apparatus.

FIG. 1 is a schematic view of an EFEM 74 including a load port apparatus 10 according to an embodiment of the present invention and a container 80 mounted on the load port apparatus 10.

The load port apparatus 10 shown in FIG. 1 constitutes a part of the EFEM 74. The EFEM 74 forms a minienvironment provided with, for example, a transportation robot 76 for transporting substrates 90. The transportation robot 76 takes the substrates 90 (e.g., silicon wafer) contained in the container 80 connected to the minienvironment by the load port apparatus 10 and transports the substrates 90 into semiconductor processors.

The EFEM 74 includes a fan 77, a filter 78, and the like. The minienvironment formed in the EFEM 74 is maintained in a clean environment.

The container 80 is a container used for transporting the substrates 90 to be processed to each processor in a semiconductor factory and is, for example, a FOUP. The container 80 can contain a plurality of substrates 90 and includes a shelf (not illustrated) for containing the substrates 90 in alignment manner and a lid 81 for opening or closing a main opening 86 for the substrates 90.

As shown in FIG. 1, purge ports 84 are arranged on a bottom 82 of the container 80. Purge nozzles 30 of the load port apparatus 10 can introduce a cleaning gas into an inside part 88 of the container 80 via the purge ports 84 of the container 80.

Figure 2:
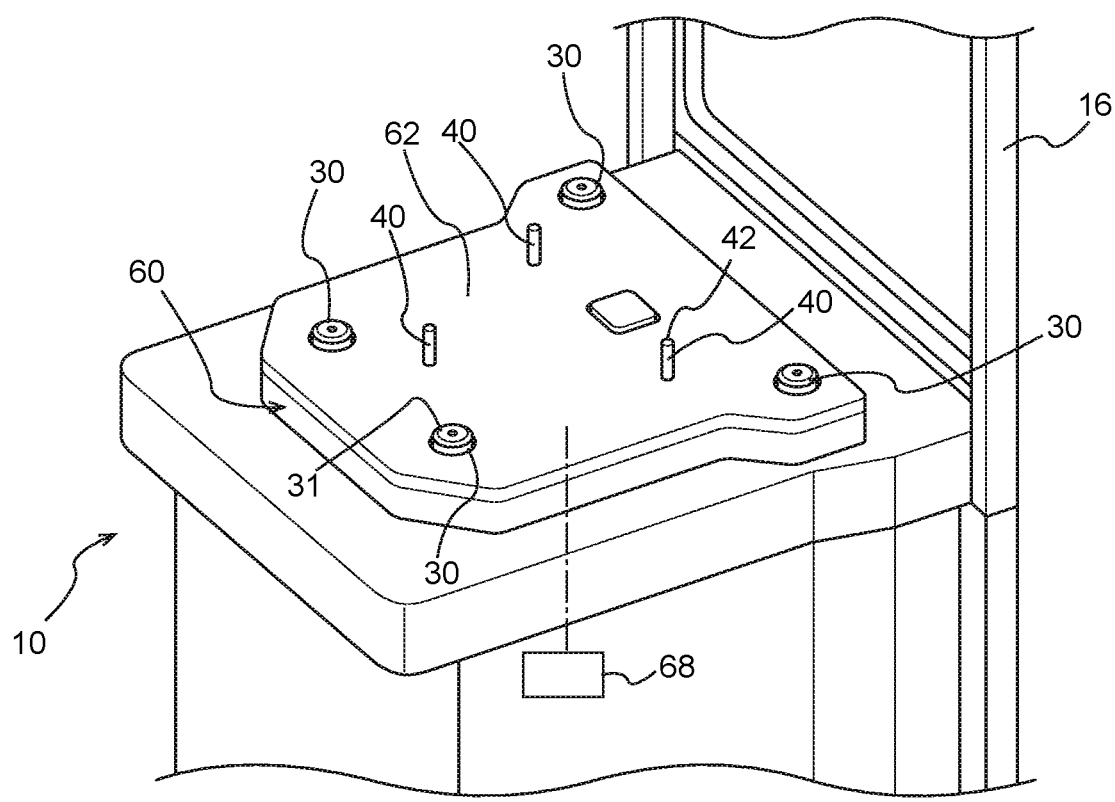
FIG. 2 is a partial perspective view of the load port apparatus shown in FIG. 1.

FIG. 2 is a perspective view of a main part of the load port apparatus 10. As shown in FIG. 2, the load port apparatus 10 includes a mount 60, the purge nozzles 30, and a plurality of pins 40. The container 80 containing the substrates 90 is mounted on the mount member 60. The purge nozzles 30 introduce a cleaning gas into the inside part 88 of the container 80 mounted on the mount member 60. Each of the pins 40 connects with a pin contact part 83 (see FIG. 3) formed at a predetermined position of the bottom 82 of the container 80 and supports the container 80 from below.

The load port apparatus 10 includes three pins 40 and four purge nozzles 30, but each number of pins 40 and purge nozzles 30 is not limited thereto. Some of the purge nozzles 30 can function as a discharger for discharging the gas of the inside part 88 of the container 80 via the purge ports 84.

As shown in FIG. 1, in addition to the purge nozzles 30, the pins 40, and the like, the load port apparatus 10 includes a frame 16 with a frame opening 16a connectable with the main opening 86 of the container 80, a door 14 for opening or closing the lid 81 of the container 80, and the like.

Figure 3:
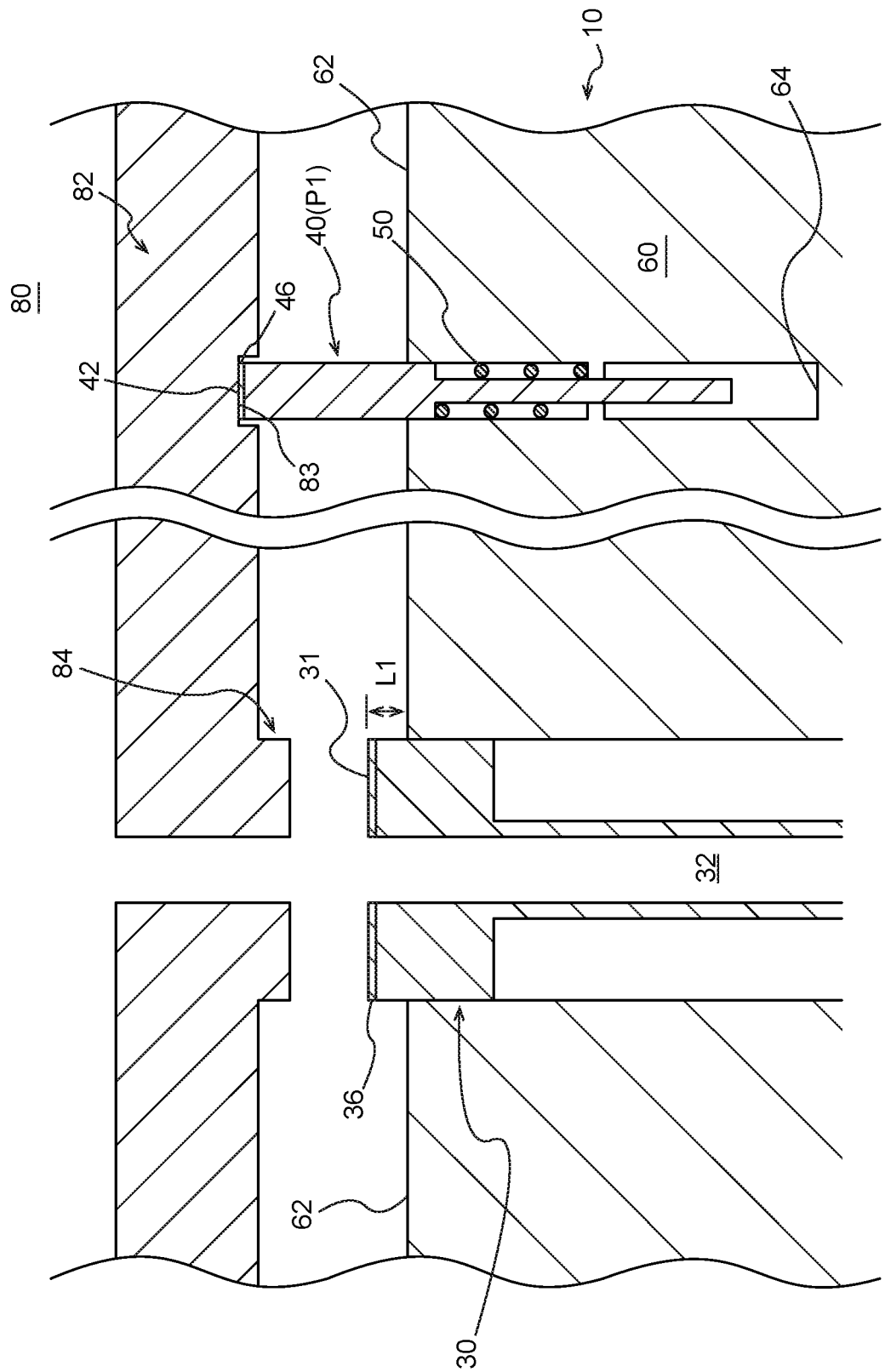
FIG. 3 is a cross-sectional view of a main part of a first position of a pin of the load port apparatus shown in FIG. 1.

The purge nozzles 30 shown in FIG. 1 and FIG. 2 are fixed on the mount member 60. The mount member 60 has a mount-member top surface 62 facing the bottom 82 of the container 80 mounted on the mount member 60. As shown in FIG. 3, the purge nozzles 30 are fixed on the mount member 60 so that upper ends 31 of the purge nozzles 30 protrude upward from the mount-member top surface 62 by a predetermined length L1. This allows the fixed purge nozzles 30 to easily connect with the purge ports 84 arranged on the bottom 82 of the container 80.

As shown in FIG. 1 and FIG. 3, a flow channel 32 for the cleaning gas is formed in each of the purge nozzles 30. As shown in FIG. 1, a connection passage 73 continuing to a gas supply part 72 is connected to the flow channel 32 of each of the purge nozzles 30. The flow channels 32 of the purge nozzles 30 are supplied with the cleaning gas from the gas supply part 72 via the connection passage 73. For example, the gas supply part 72 is a gas tank.

The cleaning gas to be supplied to the flow channels 32 of the purge nozzles 30 may be any gas (e.g., dry air (CDA), inert gas), but is preferably a nitrogen gas. The gas supply to the purge nozzles 30 is controlled by, for example, a control part 70 for controlling a solenoid valve (not illustrated) or so disposed in the connection passage 73.

As shown in FIG. 2, the load port apparatus 10 includes three pins 40, and an upper tip 42 of each of the pins 40 protrudes upward from the mount-member top surface 62. In the load port apparatus 10, as shown in FIG. 3 and FIG. 4, the purge nozzles 30 are fixed on the mount member 60, but the pins 40 are relatively vertically movable to the mount member 60.

Figure 4:
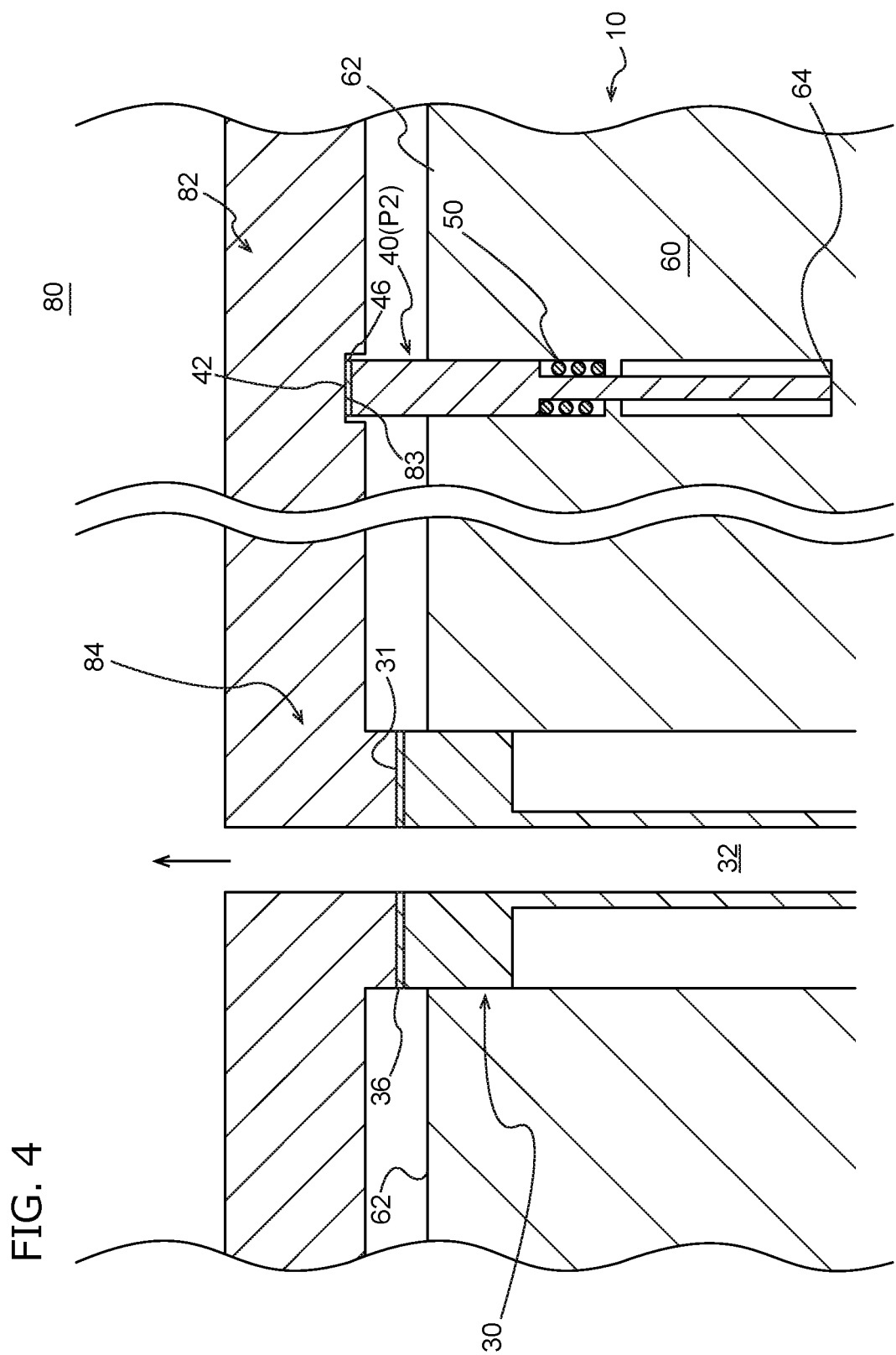
FIG. 4 is a cross-sectional view of a main part of a second position of a pin of the load port apparatus shown in FIG. 1.

FIG. 3 and FIG. 4 are a cross-sectional view illustrating a position relation among the pins 40, the purge nozzles 30, and the bottom 82 of the container 80. FIG. 3 illustrates a state where the pins 40 are located at a first position (P1). FIG. 4 illustrates a state where the pins 40 are located at a second position (P2). As shown in FIG. 3 and FIG. 4, each of the pins 40 can move vertically between the first position (P1) shown in FIG. 3 and the second position (P2) shown in FIG. 4, where the upper tip 42 of each of the pins 40 is located lower than that at the first position (P1).

As shown in FIG. 3, the upper tip 42 of each of the pins 40 at the first position (P1) is located higher than the upper end 31 of each of the purge nozzles 30. Thus, the upper tip 42 of each of the pins 40 at the first position (P1) contacts with the pin contact part 83 at a predetermined position of the container 80 while the purge port 84 is away upward from the purge nozzle 30. As with the purge ports 84, the pin contact parts 83 are formed on the bottom 82 of the container 80.

As shown in FIG. 3, the load port apparatus 10 includes an energization member 50 for energizing each of the pins 40 upward from the second position P2 toward the first position P1. Since the energization member 50 energizes each of the pins 40 upward, the container 80 is not mounted on the mount member 60, and the pins 40 are located at the first position P1 while the bottom 82 of the container 80 is not contacted with the pins 40. The energization member 50 may be any member, such as springs (e.g., coil spring, leaf spring, air spring).

The energization member 50 shrinks by a contact of the upper tip 42 of each of the pins 40 with the pin contact part 83 of the container 80 and a downward force from the container 80 to each of the pins 40 (a gravity acting on the container 80). Then, the pins 40 move from the first position P1 located above to the second position P2 located below.

The load port apparatus 10 includes a stopper 64 for stopping a downward movement of each of the pins 40 at the second position (P2). The downward movement of each of the pins 40 by mounting the container 80 stops at the second position (P2) shown in FIG. 4. The stopper 64 is, for example, a surface for supporting each of the pins 40 from below and restricting the downward movement of each of the pins 40, but may be formed by any structure for stopping the movement of each of the pins 40.

As shown in FIG. 4, the upper tip 42 of each of the pins 40 at the second position P2 contacts with the pin contact part 83 of the container 80 while the purge port 84 is contacted with the purge nozzle 30. In other words, the second position P2 of the pins 40 is configured so that the downward movement of the container 80 stops at contact positions between the purge nozzles 30 and the purge ports 84.

As shown in FIG. 4, since the purge port 84 of the container 80 is pushed against the purge nozzle 30 by the gravity acting on the container 80, the purge port 84 and the purge nozzle 30 are connected securely. The elasticity of the energization members 50 reduces the speed of the downward movement of the pins 40 and the container 80. This can prevent a strong collision between the purge nozzle 30 and the purge port 84.

As shown in FIG. 3 and FIG. 4, each of the pins 40 may include a second detector 46 for detecting a contact between each of the pins 40 and the pin contact part 83 of the container 80. For example, the second detector 46 is a contact sensor that is disposed near the upper tip 42 of each of the pins 40 and detects a contact with the pin contact part 83, a pressure sensor that detects a pressure acting on each of the pins 40, or the like. A detection signal of the second detector 46 is inputted into the control part 70 of the load port apparatus 10.

Due to the second detectors 46, the load port apparatus 10 can confirm whether or not the container 80 is correctly mounted to the pins 40. When each of the second detectors 46 is a pressure sensor, the load port apparatus 10 can detect not only the mounting of the container 80 to the pins 40, but a contact pressure between the purge nozzle 30 and the purge port 84 based on a difference between the gravity acting on the container 80 and the pressure acting on each of the pins 40.

As shown in FIG. 3 and FIG. 4, each of the purge nozzles 30 may include a first detector 36 for detecting a contact between the purge nozzle 30 and the purge port 84. For example, the first detector 36 is a contact sensor that is disposed near the upper end 31 of the purge nozzle 30 and detects a contact with the purge port 84, a pressure sensor that detects a pressure acting on the purge nozzle 30, or the like. As with the detection signal of the second detector 46, a detection signal of the first detector 36 is inputted into the control part 70 of the load port apparatus 10.

Due to the first detectors 36, the load port apparatus 10 can confirm whether or not the purge ports 84 of the container 80 are connected to the purge nozzles 30 with an appropriate strength. When each of the first detectors 36 is a pressure sensor or a surface pressure sensor having a plurality of measurement points corresponding to a plurality of positions of a contact surface, the load port apparatus 10 can distinguish an incomplete connection of the purge nozzles 30 with the purge ports 84 (e.g., oblique contact) from a complete connection.

As shown in FIG. 2, the load port apparatus 10 includes a horizontal driver 68 for horizontally moving the mount member 60 or so. The horizontal driver 68 horizontally moves the mount member 60, the purge nozzles 30, and the pins 40 located at the second position P2 by mounting the container 80 (see FIG. 3) while maintaining a position relation among the mount member 60, the purge nozzles 30, the pins 40, and the container 80. For example, the horizontal driver 68 is a motor, an air cylinder, etc. for moving the mount member 60, but is not limited. The load port apparatus 10 can connect the main opening 86 of the container 80 with the frame opening 16*a* while the purge nozzles 30 and the purge ports 84 are connected.

As shown in FIG. 2, the mount member 60 preferably includes three pins 40, and each of the pins 40 preferably has an adjusted height so as to horizontally support the container 80. Preferably, the pins 40 do not move horizontally, but move only vertically. That is, a horizontal relative position of the container 80 to the mount member 60 is preferably constant between a first contact state of the pins 40 at the first position (P1) with the container 80 as shown in FIG. 3 and a second contact state of the pins 40 at the second position P2 with the container 80 as shown in FIG. 4. The container 80 is positioned to the mount member 60 by the pins 40, and they advantageously function as kinematic pins.

Figure 5:
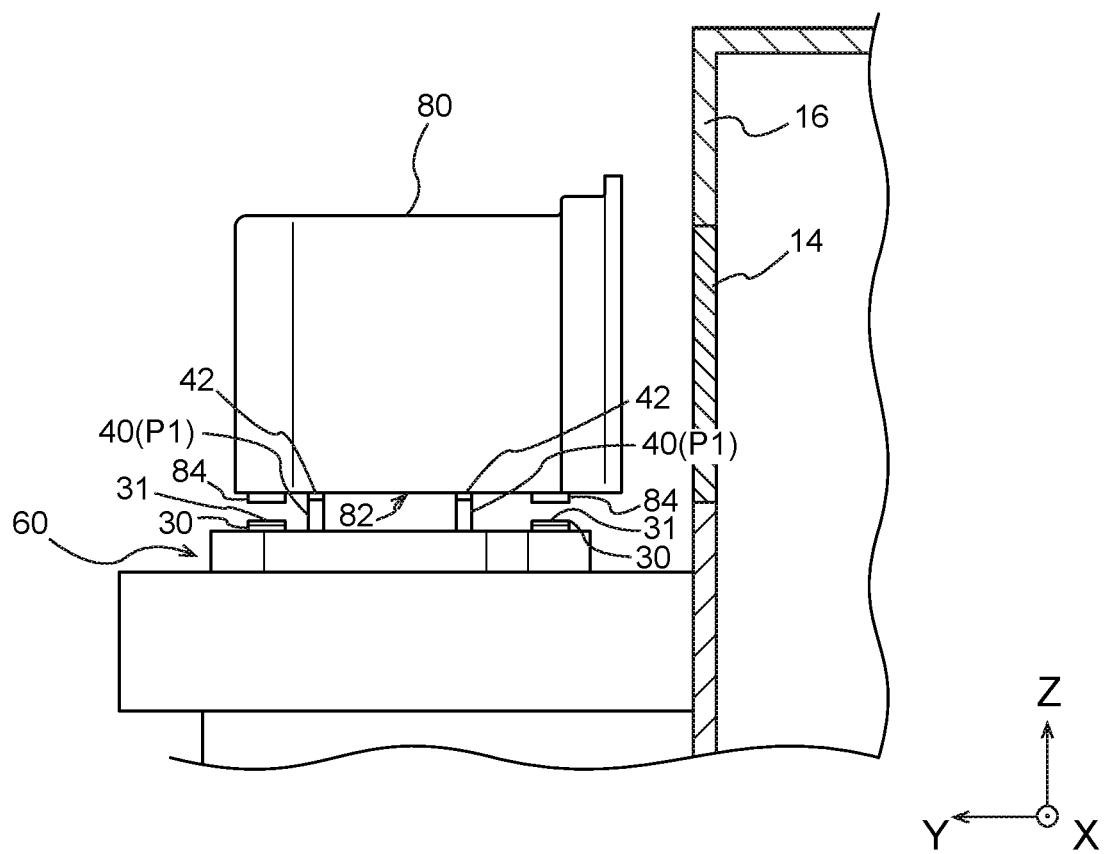
FIG. 5 is a conceptual view of first and second steps of a method of mounting the container by the load port apparatus shown in FIG. 1.
Figure 6:
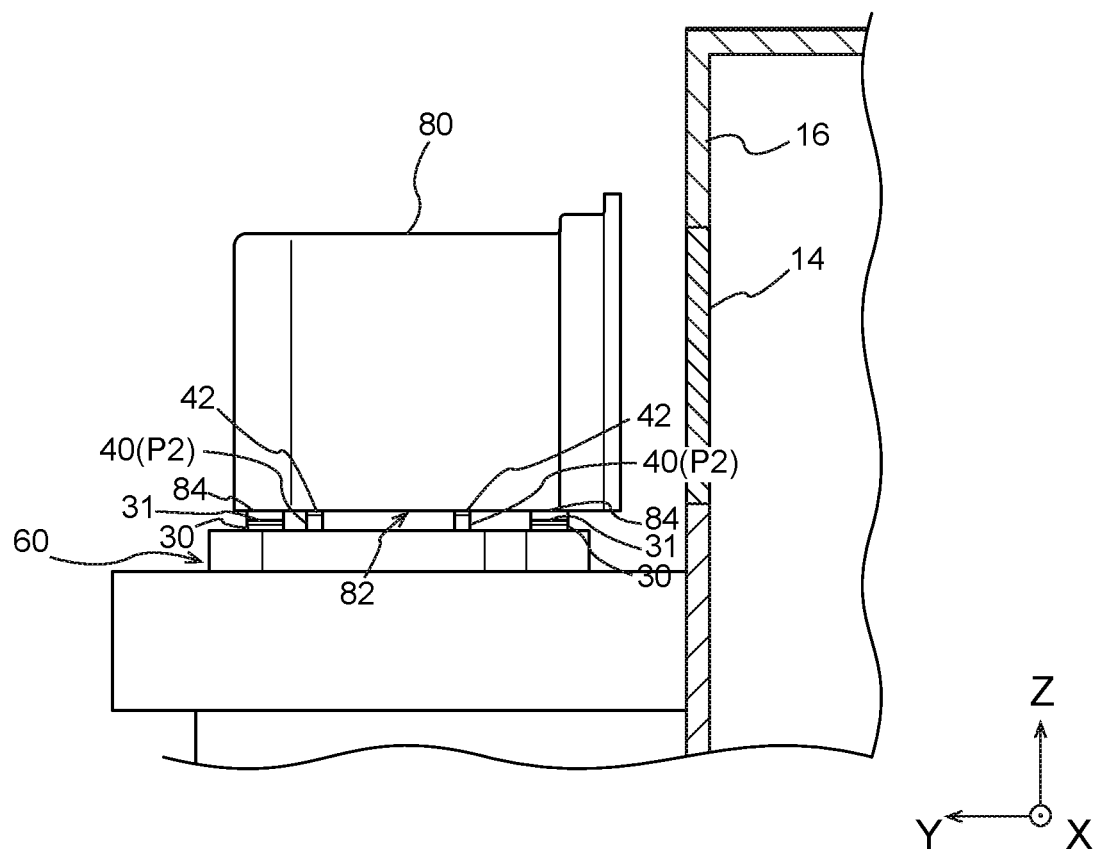
FIG. 6 is a conceptual view of third to fifth steps of a method of mounting the container by the load port apparatus shown in FIG. 1.
Figure 7:
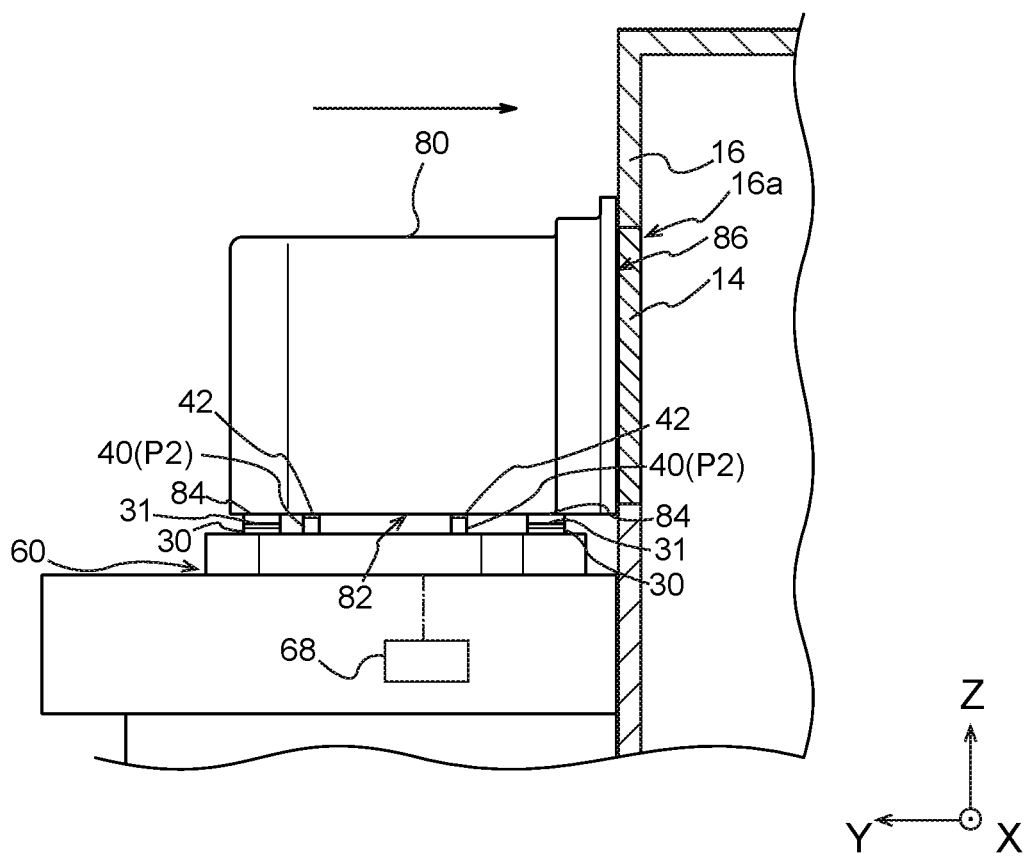
FIG. 7 is a conceptual view of a seventh step of a method of mounting the container by the load port apparatus shown in FIG. 1.
Figure 10:
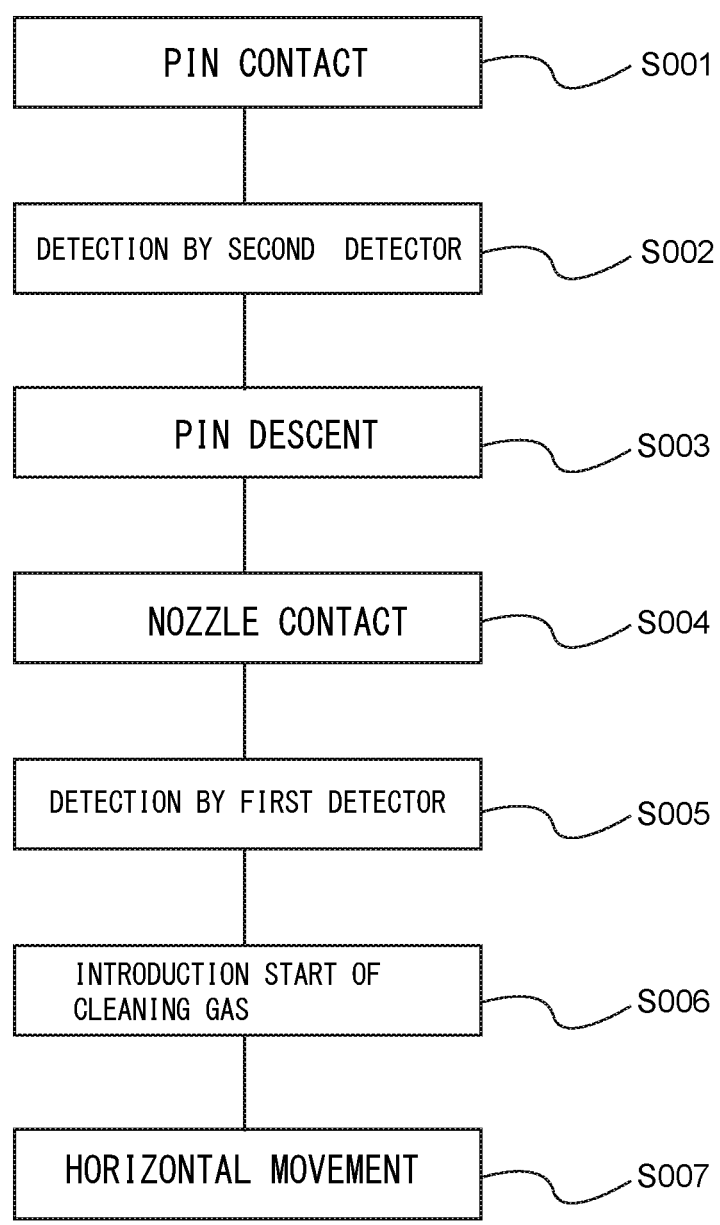
FIG. 10 is a flowchart illustrating a method of mounting the container by the load port apparatus shown in FIG. 1.

Hereinafter, a method of mounting the container 80 using the load port apparatus 10 is explained with reference to the figures. FIG. 5 to FIG. 7 are a conceptual view illustrating some steps of the method of mounting the container 80 using the load port apparatus 10 shown in FIG. 1. FIG. 10 is a flowchart illustrating the method of mounting the container 80.

In the method of mounting the container 80 using the load port apparatus 10, as shown in FIG. 10, the container 80 is transported to the mount member 60 using the load port apparatus 10, and the upper tip 42 of each of the pins 40 at the first position P1 contacts with the pin contact part 83 disposed on the bottom 82 of the container 80 (Step S001). In Step S001 (the pins 40 are located at the first position P1), as shown in FIG. 5, the purge ports 84 arranged on the bottom 82 of the container 80 are away from the purge nozzles 30 fixed on the mount member 60.

In Step S002 shown in FIG. 10, the second detector 46 detects a contact between each of the pins 40 and the pin contact part 83 of the container 80. This allows the control part 70 of the load port apparatus 10 (FIG. 1) to confirm that the container 80 is correctly mounted to the pins 40. Incidentally, the container 80 is transported to the mount member 60 of the load port apparatus 10 by, for example, an OHT disposed in a semiconductor factory. The pins 40 of the load port apparatus 10 are at least located at the first position P1 at the beginning of Step S001.

In Step S003 shown in FIG. 10, the pins 40 move downward from the first position (P1) shown in FIG. 3 and FIG. 5 to the second position (P2) shown in FIG. 4 and FIG. 6 while the upper tips 42 of the pins 40 are contacted with the pin contact parts 83 of the container 80. That is, the gravity acting on the container 80 travels to the pins 40 via the pin contact parts 83, and the pins 40 are thereby pushed downward while the energization members 50 are deformed.

In Step S004 shown in FIG. 10, as shown in FIG. 6, the pins 40 move to the second position (P2), and the purge ports 84 of the container 80 contact with the purge nozzles 30. In Step S004, as shown in FIG. 4 and FIG. 6, the contact between the upper tips 42 of the pins 40 and the pin contact parts 83 of the container 80 is maintained. In Step S004, the container 80 is positioned to the mount member 60, and the purge ports 84 and the purge nozzles 30 are connected.

In Step S005 shown in FIG. 10, each of the first detectors 36 (FIG. 4) detects the contact between the purge nozzle 30 and the purge port 84 of the container 80. This allows the control part 70 of the load port apparatus 10 (FIG. 1) to confirm that the purge ports 84 and the purge nozzles 30 are correctly connected.

In Step S006 shown in FIG. 10, the control part 70 of the load port apparatus 10 supplies a cleaning gas to the purge nozzles 30, and the cleaning gas is supplied into the container 80 via the purge ports 84. In Step S007, as shown in FIG. 7, the horizontal driver 68 horizontally moves the mount member 60, the purge nozzles 30, the pins 40, and the container 80, and the main opening 86 of the container 80 is connected to the frame opening 16*a* formed on the frame 16.

As explained with FIG. 1 to FIG. 7 and FIG. 10, although the purge nozzles 30 are fixed to the mount member 60, the load port apparatus 10 and the method of mounting the container 80 using the load port apparatus 10 can appropriately connect the purge nozzles 30 with the purge ports 84 and clean the container 80. Thus, the load port apparatus 10 can prevent particles from flowing into the flow channels 32 for cleaning gas and also prevent the purge nozzles 30 from excessively strongly colliding with the purge ports 84 in mounting the container 80 and in connecting the purge nozzles 30. Moreover, the load port apparatus 10 does not have a problem of inclination of the container 80 due to upthrust by the purge nozzles 30 against the load port apparatus 10 and can thereby advantageously prevent problems generated in conventional load port apparatuses where purge nozzles rise and connect with purge ports. Even if the shape of the bottom 82 of the container 80 is uneven in dimension, the load port apparatus 10 can appropriately connect the purge nozzles 30 with the purge ports 84.

Figure 8:
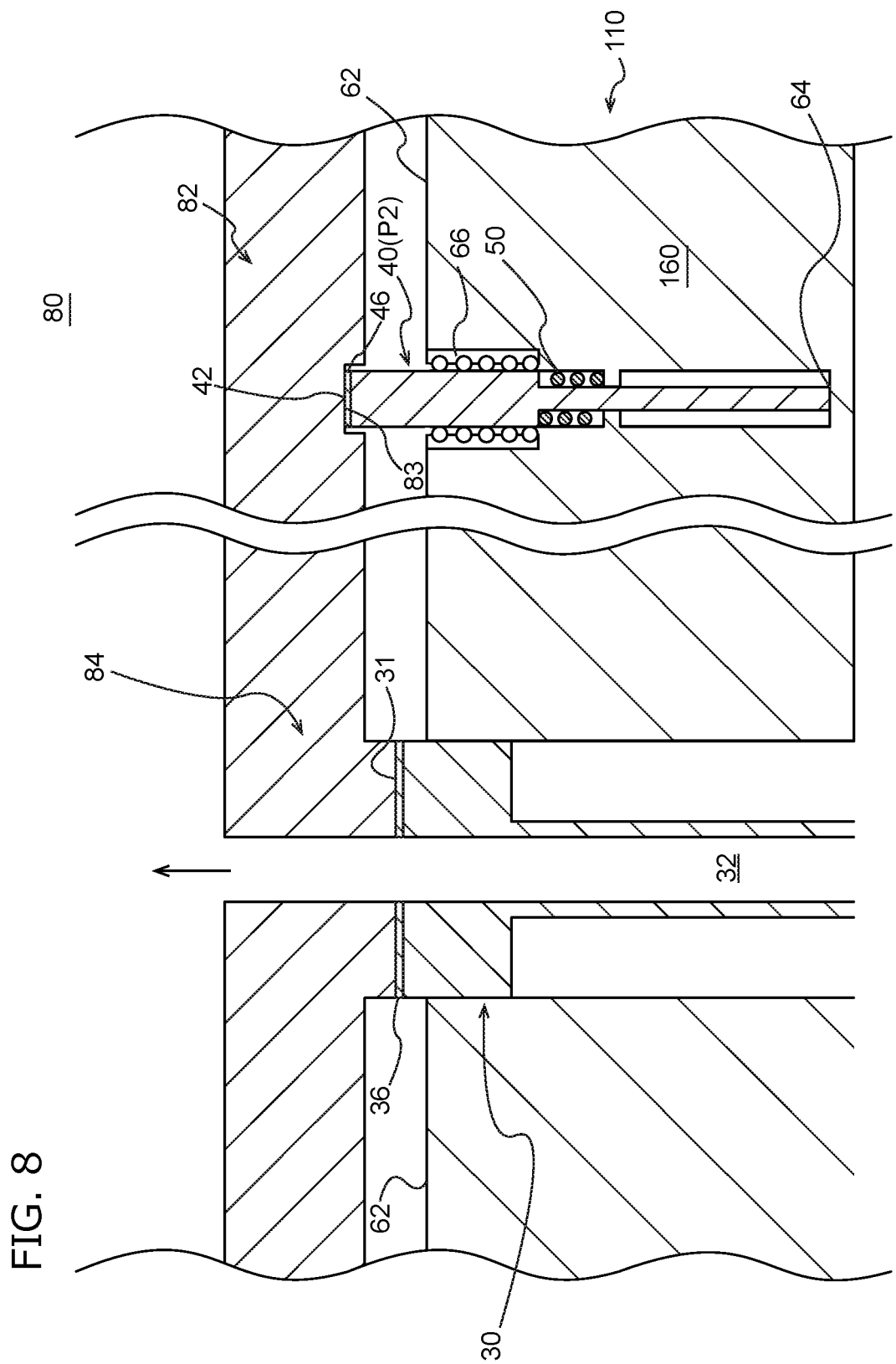
FIG. 8 is a cross-sectional view of a main part of surroundings of a mount of a load port apparatus according to First Modification.

The present invention is explained with the load port apparatus 10 according to the embodiment, but is not limited to the above-mentioned embodiment. Needless to say, the present invention includes other embodiments and modifications. FIG. 8 illustrates a mount member 160 of a load port apparatus 110 according to First Modification.

The mount member 160 of the load port apparatus 110 according to First Modification is different from the mount member 60 shown in FIG. 4 in that the mount member 160 includes guides 66, but the mount member 160 is similar to the mount member 60 in terms of other matters. Each of the guides 66 restricts a horizontal movement of each of the pins 40 and guides a vertical relative movement of each of the pins 40. The guides 66 are not limited, but may be one including multiple rolling balls for guiding the movement of the pins 40 as shown in FIG. 8.

Since the pins 40 are smoothly vertically movable along the guides 66, the mount member 160 of the load port apparatus 110 according to First Modification can further smoothly carry out mounting operations of the container 80 including a connection between the purge nozzles 30 and the purge ports 84. Moreover, the mount member 160 of the load port apparatus 110 according to First Modification can prevent a problem of generation of particles due to the movement of the pins 40.

Figure 9:
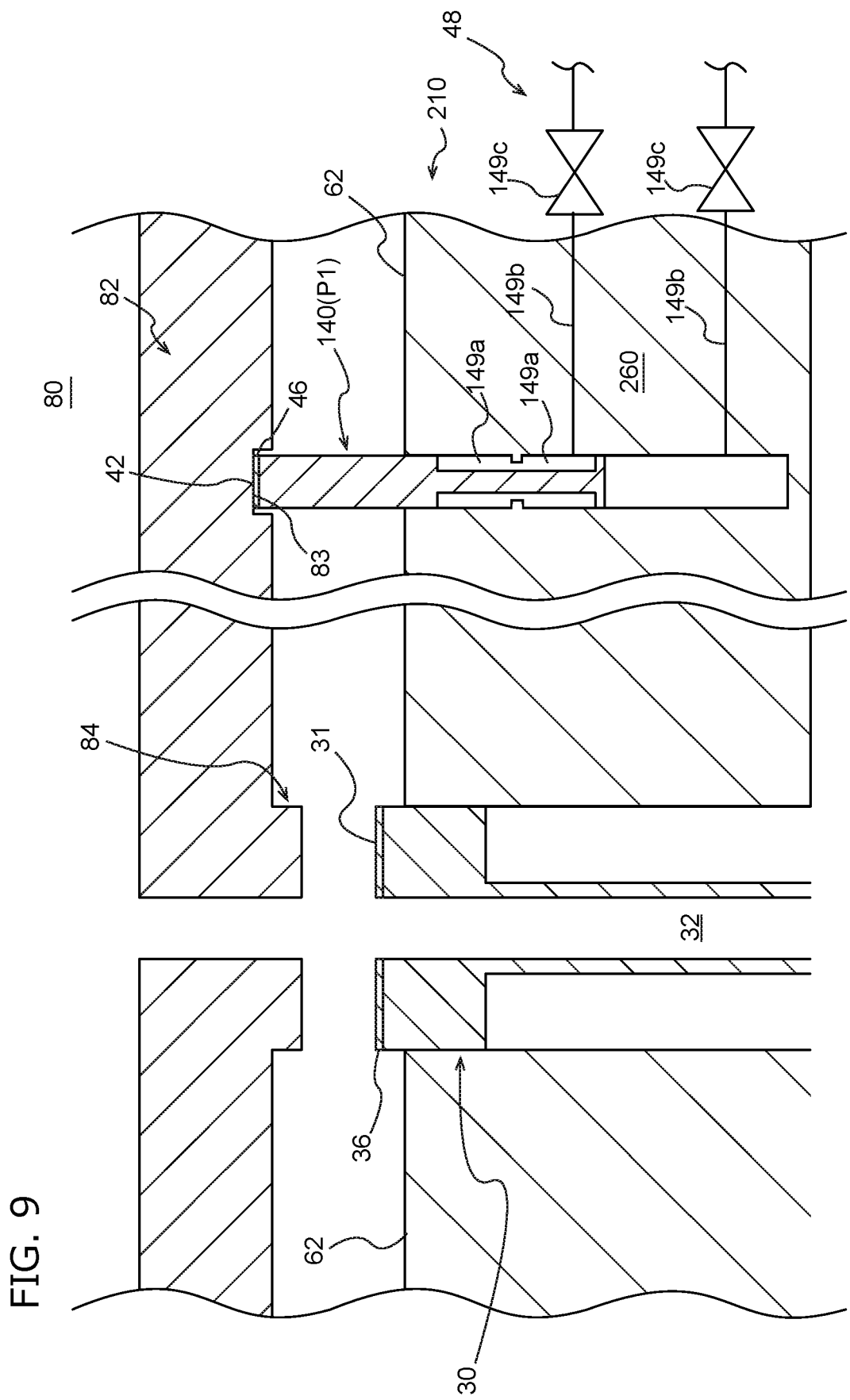
FIG. 9 is a cross-sectional view of a main part of surroundings of a mount of a load port apparatus according to Second Modification.

FIG. 9 illustrates a mount member 260 of a load port apparatus 210 according to Second Modification. The load port apparatus 210 according to Second Modification is different from the load port apparatus 10 shown in FIG. 4 in that the load port apparatus 210 includes a pin driver 48 for driving pins 140, and that the pins 140 form pistons driven by the pin driver 48, but the load port apparatus 210 according to Second Modification is similar to the load port apparatus 10 according to the above-mentioned embodiment in terms of other matters.

The pin driver 48 shown in FIG. 9 includes a pressure passage 149b connecting between a pressure chamber 149a and a pressure source formed in the surroundings of the pins 140, a solenoid valve 149c disposed in the pressure passage 149b, and the like. The pins 140 move vertically based on change of the pressure chamber 149a formed in the surroundings of the pins 140.

The pin driver 48 can move the pins 140 between the first position (P1) and the second position (P2). Thus, the load port apparatus 210 including the pin driver 48 can stop the pins 140 so that they do not move from the first position (P1) in the contact of the container 80 with the pins 140. In this case, the pins 140 at the first position (P1) support the container 80 from below so that the bottom 82 of the container 80 is away upward from the upper ends 31 of the purge nozzles 30.

The load port apparatus 210 including the pin driver 48 controls a vertical movement of the pins 140 and thereby makes it possible to prevent a problem of strong collision between the purge nozzles 30 and the purge ports 84 and to adjust a collision strength between the purge nozzles 30 and the purge ports 84. Moreover, the collision strength between the purge nozzles 30 and the purge ports 84 can further appropriately be adjusted by, for example, controlling the vertical movement of the pins 140 based on the weight of the container 80 to be mounted.

DESCRIPTION OF THE REFERENCE NUMERICAL

10 . . . load port apparatus
14 . . . door
16 . . . frame
16a . . . frame opening
30 . . . purge nozzle
31 . . . upper end
32 . . . flow channel
36 . . . first detector
40 . . . pin
42 . . . upper tip
46 . . . second detector
50 . . . energization member
48 . . . pin driver
60 . . . mount member
62 . . . mount-member top surface
64 . . . stopper
66 . . . guide
68 . . . horizontal driver
P1 . . . first position
P2 . . . second position
L1 . . . predetermined length
72 . . . gas supply part
73 . . . connection passage
70 . . . control part
74 . . . EFEM
76 . . . transportation robot
77 . . . fan
78 . . . filter
80 . . . container
81 . . . lid
82 . . . bottom
83 . . . pin contact part
84 . . . purge port
86 . . . main opening
88 . . . inside part
90 . . . substrate

What is claimed is:

1. A load port apparatus comprising:
a mount member configured to mount a container for containing a substrate;
a purge nozzle configured to introduce a cleaning gas into the container mounted on the mount member via a purge port in a bottom of the container;
a plurality of pins configured to support the container from below by each of the plurality of pins contacting a pin contact part at a predetermined position of the bottom of the container; and
a pin moving mechanism configured to move and hold the plurality of pins in set positions; wherein
the each of the plurality of pins (1) is vertically movable by the pin moving mechanism relative to the mount member between a first predetermined position and a second predetermined position of the set positions and (2) includes an upper tip,
the upper tip of the each of the plurality of pins (1) is located lower when the each of the plurality of pins is in the second position than when the each of the plurality of pins is in the first position and (2) contacts a surface of the pin contact part facing a top surface of the mount member,
the plurality of pins is configured such that, when the plurality of pins is in the first predetermined position and the container is mounted on the plurality pins, the plurality of pins supports and holds the container such that the container is in a set container position relative to the mount member in which
the purge port is spaced from the purge nozzle,
when the plurality of pins supports the container with the each of the plurality of pins in the second predetermined position, the purge port is in contact with the purge nozzle,
the mount member has a stopper configured to stop a downward movement of the each of the plurality of pins at the second predetermined position, and
the pin moving mechanism is a pin driver configured to move the plurality of pins between the first predetermined position and the second predetermined position.

2. The load port apparatus according to claim 1, further comprising a horizontal driver configured to horizontally move the mount member, the purge nozzle, and the plurality of pins located at the second predetermined position while maintaining a position relation among the mount member, the purge nozzle, and the plurality of pins.

3. The load port apparatus according to claim 1, wherein
the top surface of the mount member faces the bottom of the container mounted on the mount member,
the plurality of pins and the purge nozzle protrude upward from the top surface, and
the upper tip of the each of the plurality of pins at the first predetermined position is located higher than an upper end of the purge nozzle.

4. The load port apparatus according to claim 1, wherein the plurality of pins, when in the first position predetermined position, support the container from below so that the bottom of the container is located spaced from an upper end of the purge nozzle.

5. The load port apparatus according to claim 1, wherein
the top surface of the mount member faces the bottom of the container mounted on the mount member, and
the purge nozzle is fixed to the mount member so that an upper end of the purge nozzle protrudes upward from the top surface by a predetermined length.

6. The load port apparatus according to claim 1, wherein the purge nozzle includes a first detector configured to detect a contact between the purge nozzle and the purge port.

7. The load port apparatus according to claim 1, wherein the each of the plurality of pins includes a detector configured to detect a contact between the each of the plurality of pins and the pin contact parts of the container.

8. The load port apparatus according to claim 1, wherein the mount member includes a guide configured to guide a vertical relative movement of the each of the plurality of pins by restricting a horizontal movement of the each of the plurality of pins.

9. The load port apparatus according to claim 1, wherein
the number of the plurality of pins is at least three, and
a horizontal relative position of the container to the mount member is constant between a first contact state of the container with the plurality of pins at the first predetermined position and a second contact state of the container with the plurality of pins at the second predetermined position.

10. A method of mounting a container containing a substrate on a load port apparatus including:
a mount member configured to mount the container;
a purge nozzle configured to introduce a cleaning gas into the container via a purge port in a bottom of the container;
a plurality of pins configured to support the container from below by each of the plurality of pins contacting a pin contact part at a predetermined position of the bottom of the container; and
a pin moving mechanism configured to move and hold the plurality of pins in set positions relative to the mount member and the purge nozzle,
wherein the each of the plurality of pins has an upper tip that supports the container from below by contacting a surface of the pin contact part that faces a top surface of the mount member,
the method comprising the steps of:
holding the purge port spaced from the purge nozzle by contact between the upper tips and the pin contact parts when the plurality of pins is in a first position, the plurality of pins supporting the container when the plurality of pins is in the first position and the pin contact parts contact the upper tips;
moving the plurality of pins downward by the pin moving mechanism from the first position while the upper tip of the each of the plurality of pins is in contact with the the pin contact parts; and
stopping the downward movement of the each of the plurality of pins in a second position by a stopper provided at the mount member, holding the purge port in contact with the purge nozzle by contact between the upper tips and the pin contact parts when the plurality of pins is in the second position; wherein
the pin moving mechanism is a pin driver configured to move the plurality of pins between the first predetermined position and the second predetermined position.

* * * * *